(12) United States Patent
Isurin et al.

(10) Patent No.: US 6,570,416 B1
(45) Date of Patent: May 27, 2003

(54) LOSSLESS GATE DRIVER CIRCUIT

(75) Inventors: Alexander Isurin, Columbus, OH (US); Alexander Cook, Dublin, OH (US)

(73) Assignee: Vanner, Inc., Hilliard, OH (US)

( * ) Notice: Subject to any disclaimer, the term of this patent is extended or adjusted under 35 U.S.C. 154(b) by 0 days.

(21) Appl. No.: 10/044,693

(22) Filed: Jan. 11, 2002

(51) Int. Cl.[7] ............................ H03K 3/00; H03K 17/56
(52) U.S. Cl. ...................... 327/109; 327/427; 327/424
(58) Field of Search ........................ 327/427, 434–437, 327/108, 109, 110, 111, 112, 423, 424, 588

(56) References Cited

U.S. PATENT DOCUMENTS

| | | | | |
|---|---|---|---|---|
| 4,491,744 A | * | 1/1985 | Corey | 327/109 |
| 4,774,419 A | * | 9/1988 | D'Ariano | 327/109 |
| 4,873,460 A | * | 10/1989 | Rippel | 327/437 |
| 5,204,561 A | * | 4/1993 | Rischmuller | 327/427 |

* cited by examiner

Primary Examiner—Toan Tran
(74) Attorney, Agent, or Firm—James R. Eley; Thompson Hine LLP

(57) ABSTRACT

A method and apparatus are taught for driving a gate of a power device to turn on the power device utilizing a lossless gate driver circuit. The circuit comprises in parallel a power section, a rectifying section, a switching section, a capacitance, and an anti-spiking section. The circuit further comprises a transformer section coupled to the rectifying section, the switching section, and the anti-spiking section and a power device coupled to a portion of the anti-spiking section. The system is configured to regenerate substantially all energy utilized to power the power device via the coupling of the transformer section to the rectifying section, the switching section, the capacitance, and the anti-spike section.

16 Claims, 2 Drawing Sheets

LOSSLESS GATE DRIVER CIRCUIT

FIELD OF THE EMBODIMENTS

Embodiments are directed towards circuits utilized to energize power devices. More particularly, embodiments relate to a method and apparatus for a driver circuit utilized to energize a power device, where the driver circuit exhibits substantially no energy loss, and thus higher efficiency.

BACKGROUND

Traditionally, a MOSFET or IGBT is utilized as a power switch or power device, where gate control, i.e., turning ON and OFF of the power device, is achieved by charging and discharging an input capacitance of the power device. When the capacitance has a relatively simple charge and discharge circuit, energy received by the capacitance is dissipated in the active and passive components of a circuit. This loss of energy is acceptable when the value of the capacitance is low, e.g., 2 nF–5 nF, and the commutation frequency is also relatively low. A problem arises when the capacitance is increased to the 50 nF–100 nF range, and the commutation frequency is 100 kHz or more. In those cases, both the power dissipation and equipment size increase. This results in throwing away energy, which although may seem miniscule for each instance of time, dramatically increases in magnitude over time for limited energy systems, e.g., solar systems, and for loads that remain in an idle state continuously, i.e., requiring small amounts of energy for long periods of time.

One way to solve these problems has been to utilize resonant power exchange. However, this has several disadvantages, one of which is that the circuit must be relatively complex for high efficiency. Another way of solving these problems is to utilize drive switches to turn ON and OFF the main switches, which would connect the gate of the power device to a DC supply. This results in excess energy loss through heating of the device. For example, if you charge the power device capacitance to 10 V you throw away as much energy as you put into the capacitance. Then, when you turn off the power device to discharge it you throw that energy away. Thus, you lose half the energy turning it ON and half the energy turning it OFF. This has become even more of a problem as the power conversion frequency has increased into the megahertz range.

A still further way of solving these above problems has been to utilize a resonance gate driver circuit, where energy is pre-stored in an inductor. To turn ON the power device a user connects the gate of the power device to the inductor, which charges up the gate capacitance. To turn OFF the power device a user puts the energy stored in the gate capacitance back into the inductor and disconnects the gate. Although efficient, this system requires somewhat complex timing methods. This is due to the fact a user must know in advance that he is going to switch the power device ON because he needs to charge up the inductor before connecting it to the gate in order to power the device and turn it ON. This method also requires somewhat complex circuitry because there needs to be a charge and discharge circuit for the inductor. Also, there needs to be a control circuit connecting and disconnecting the inductor to the power device gate, so that after the power device gate capacitance is charged it is not discharged by the inductor. Thus, a user has to switch the inductor between a source and the power device, and then back again.

Therefore, a need exists for a highly efficient and simple circuit topology driving circuit to charge and discharge a gate capacitance to power a power device, while also maintaining linear charge and discharge waveforms. Also, a needs exists for the circuit to have short switching times to allow for short charge and discharge times, e.g., in the 40 nS to 60 nS range.

SUMMARY OF THE EMBODIMENTS

According a manifestation, a system is taught that may comprise a circuit board and a circuit. The circuit may comprise, in parallel, a power section, a rectifying section, a switching section, a capacitance, and an anti-spiking section. The circuit may further comprise a transformer section coupled to the rectifying section, the switching section, and the anti-spiking section and a power device coupled to a portion of the anti-spiking section. The system may be configured to regenerate substantially all energy utilized to power the power device via the coupling of the transformer section to the rectifying section, the switching section, the capacitance, and the anti-spike section.

In another manifestation a method may be taught for driving a gate of a power device coupled within a circuit operatively configured to substantially eliminate energy loss. The method may comprise powering the circuit with a power source. A first switch may be turned ON and a second switch may be turned OFF to allow energy from the power source to flow through the first switch to charge a power device capacitance, via an inductance, that turns ON a the power device, to charge a source capacitance, and to return a portion of the energy back to the power source. Energy from the inductance may be discharged to further charge the power device capacitance with the discharged energy from the inductance. The first switch may be turned OFF and the second switch may be turned ON to turn OFF the power device and to discharge the power device capacitance and to allow energy to flow from the power device capacitance to the source capacitance, via the inductance, to charge the source capacitance and return a portion of the energy to the power source. Finally, energy in the inductance may be discharged to further charge the source capacitance and return a portion of the energy to the power source.

A main advantage is that a simple design with no control circuit requirements can be used to power a gate of a power device by regenerating substantially all the energy used to charge up a gate capacitance through use of a transformer.

BRIEF DESCRIPTION OF THE DRAWINGS

Further features of the embodiments will become apparent to those skilled in the art to which the embodiments relate from reading the following specification and claims, with reference to the accompanying drawings, in which:

DESCRIPTION OF THE PREFERRED EMBODIMENT(S)

Figure 1:
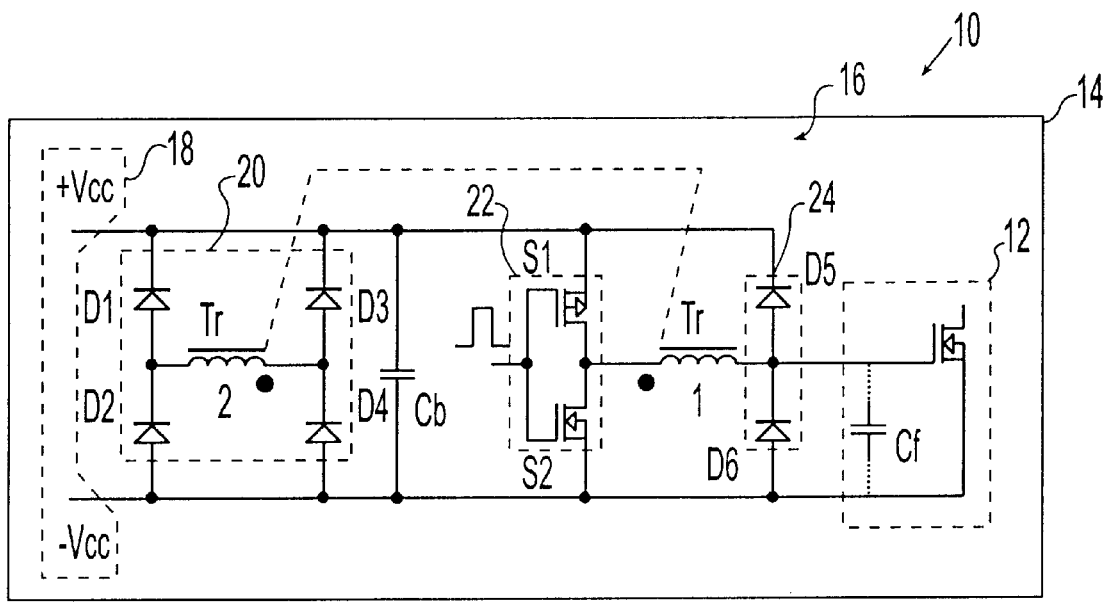
FIG. 1 is a schematic diagram of a circuit according to an embodiment.
Figure 2:
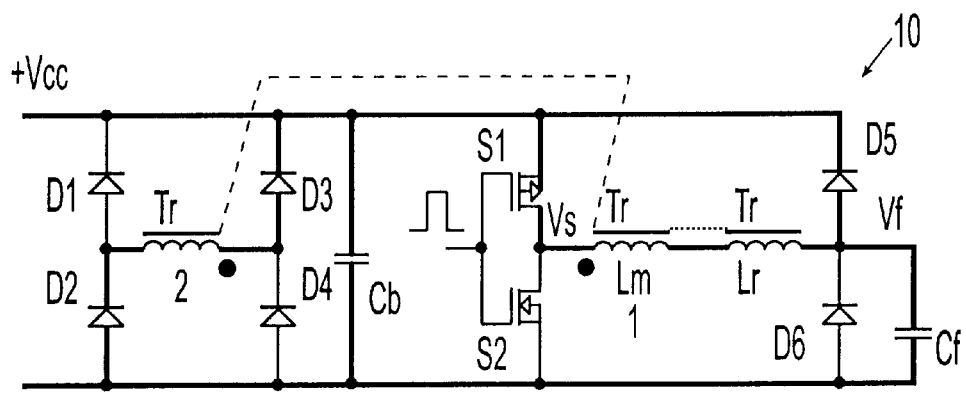
FIG. 2 is a schematic diagram showing energy flow during a first state, maybe a charging state, of the circuit in FIG. 1.
Figure 3:
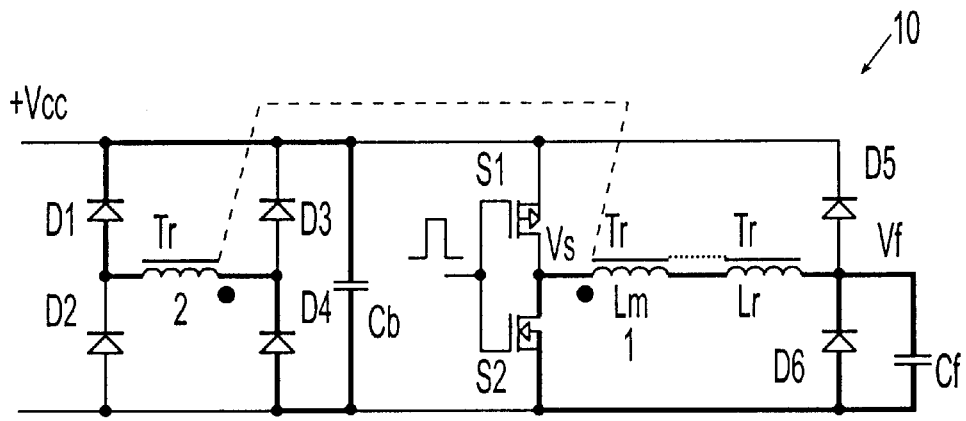
FIG. 3 is a schematic diagram showing energy flow during a second state, maybe a discharging state, of the circuit in FIG. 1.

In FIGS. 1–3, a system 10 according to an embodiment is shown. The system 10 may be a lossless gate driver circuit configured to energize a gate capacitance Cf in a power device 12, which turns on the power device 12. The system 10 comprises a circuit board 14 that comprises a circuit 16. The circuit 16 comprises, in parallel, a power section 18, a rectifying section 20, a switching section 22, a capacitance or source capacitance Cb, and an anti-spike section 24. The circuit 16 further comprises a transformer section Tr coupled to the rectifying section 20, the switch section 22, and the anti-spike section 24. Finally, the power device 12 is coupled to a portion of the anti-spike section 24.

An embodiment of the system 10 is shown in FIGS. 1–3, where FIG. 2 shows a charging state and FIG. 3 shows a discharging state. The power section 18 includes a DC power source +/−Vcc. The rectifying section 20 comprises a full wave rectifier comprising diodes D1–D4. The switching section 22 comprises first and second switches S1 and S2, respectively. The first and second switches S1 and S2 may be power devices, e.g., MOSFETs, with a period square wave input, or any other devices with a similar function. Also switching times for the first and second switches S1 and S2, respectively, may be in the 40 nS–60 nS range, or any other range that produces similar results. This is in contrast to prior art devices that required pre-control with switching times in the 0.5–1 μS range, where an inductor had to be charged prior to switching on a power device. The anti-spike section 24 comprises diodes D5–D6. The power device 12 is operatively configured as a transistor, e.g., a MOSFET or IGBT, where the gate capacitance Cf is a theoretical capacitance in the gate of the power device 12. The transformer Tr may be two co-axial wire coils located in the circuit board 14, and the transformer Tr operatively performs as a regenerative transformer.

Figure 4:
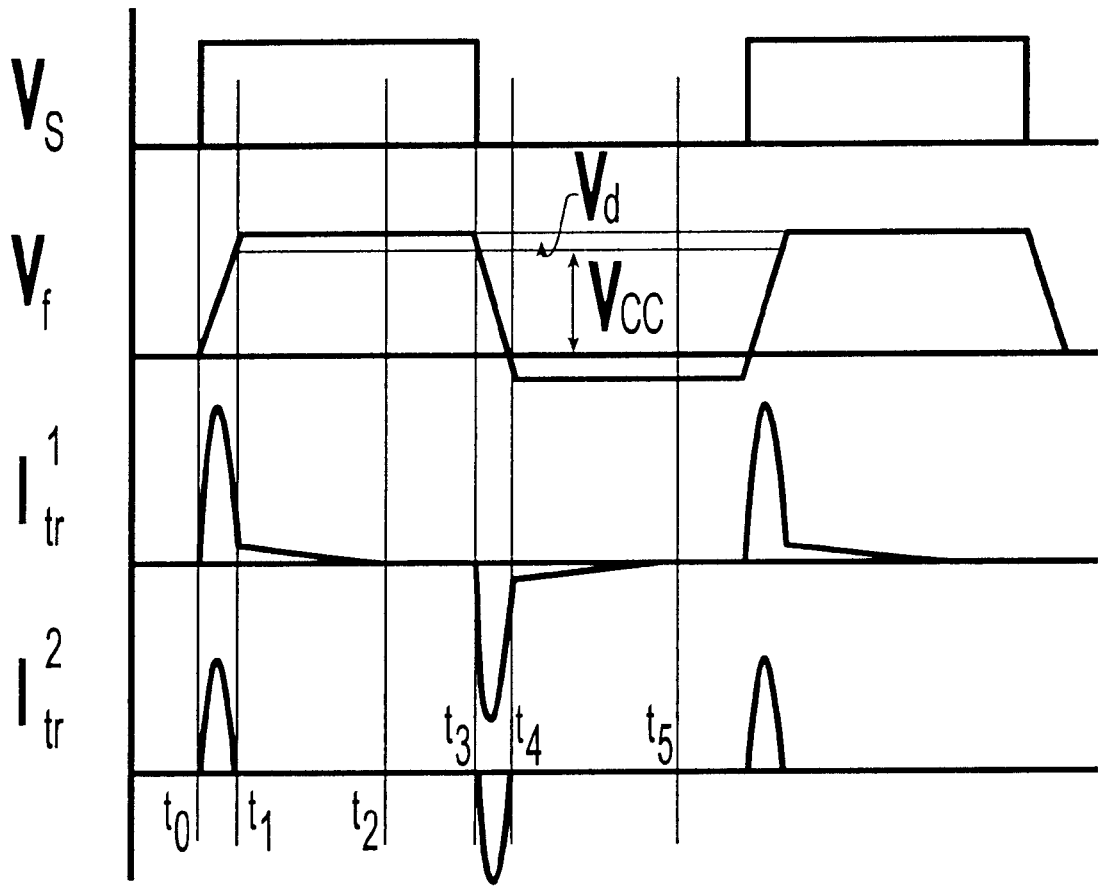
FIG. 4 is a graph showing waveforms of energy flowing through various components in the circuit in FIG. 1 at various times.

Now with reference to FIG. 4, and continuing reference to FIG. 2, an operation according to a first state of an embodiment, maybe a charging state, will be discussed. Starting at time t0, the first switch S1 is turned ON and the second switch S2 is turned OFF, where in this configuration energy flows in the following path: +Vcc→S1→Tr→Cf.

During the time period t0–t1, the secondary winding of the transformer Tr shunts the primary winding so that the resonant circuit, i.e., the leakage inductance of the transformer Tr and the gate capacitance Cf, provide the dV/dT for the gate capacitance Cf. Also in this time period t0–t1, the energy from the primary winding is coupled to the secondary winding so that the energy charges the capacitance Cb, which completes a circle of energy within the circuit 16.

At time t1 the circulating energy process stops, and the gate capacitance Cf holds a stored voltage equal to +Vcc. After t1, magnetizing energy in the transformer Tr begins discharging, where energy flows in the following path: S1→Tr→D5→+Vcc until t2, when all energy flow stops. After time period t0–t2 has elapsed, the gate capacitance Cf has stored a voltage equal to Vcc+Vd, where Vd is the forward voltage drop across the diode.

Now returning to FIG. 3, and with continuing reference to FIG. 4, an operation according to a second state of an embodiment, maybe a discharging state, will be discussed. At time t3 the gate capacitance Cf starts to discharge, where the discharge energy flows in the following path: Cf→Tr→Cb. A regeneration process occurs between times t3 and t4, where most of the energy from the gate capacitance Cf returns directly to the capacitance Cb and to the power source section 18, such that the power source section 18 receives the energy via the rectifying section 20. Also, during this time period, the operation of the transformer Tr is similar to time period t0–t1.

At time period t4, the voltage of the gate capacitance Cf is reduced to 0 V. Also, at time period t4, the magnetizing inductance of the transformer Tr begins to discharge. During this time period t4, energy flows in the following path: −Vcc→D6→Tr→S2. At time t5 the method transitions back to the state at t0 and starts over again.

Again with reference to FIG. 4, the first waveform represents the power source voltage, Vs, which is a DC input voltage +/−Vcc. The second waveform is the voltage Vf across the gate capacitance Cf. The third waveform represents the current through a primary side (labeled 1 in FIGS. 1–3) of the transformer Tr. The fourth waveform represents the current through a secondary side (labeled 2 in FIGS. 1–3) of the transformer Tr.

By utilizing the above topology for the circuit 16, energy loss may only be from conductance losses in the first and second switches S1 and S2, respectively, and diodes D3–D6. Thus, almost all the energy received by the circuit 16 is regenerated, thereby increasing efficiency, while still utilizing a relatively simple drive circuit topology. This eliminates the requirement of a separate inductance and control circuits to connect and disconnect the inductance circuit to the gate of a power device found in prior art circuitry.

The present invention achieves these results by applying energy, while S1 is ON and S2 is OFF, directly to the gate of the power device 12 via transformer Tr. During operation, the transformer Tr forms a small resonant circuit by applying voltage across the transformer Tr. As energy is dissipating, the circuit 16 effectively stores the energy until the gate capacitance Cf has stored the full supply voltage Vcc, where the energy flow is clamped by the anti-spike section 24. Next, the energy stored in the transformer Tr is dumped back into, i.e., recharges, the capacitance Cb and the supply section 18, where the supply section 18 receives the energy via the rectifying section 20. Then, when S1 if OFF and S2 is ON, the charge empties or discharges from the gate capacitance Cf in a reverse order, compared to the charging, because the circuit 16 is perfectly symmetrical. Therefore, the resonance circuit is represented by the gate capacitance Cf and the transformer Tr, where the transformer Tr may be integral with the circuit board 14 and not a separate component. In another embodiment the transformer Tr can be coreless.

The invention has been described in detail with respect to specific embodiments thereof, but it will be apparent that numerous variations and modifications are possible without departing from the spirit and scope of the invention as defined by the following claims.

We claim:

1. A system comprising a circuit board that comprises a circuit:

the circuit comprising, in parallel:
        a power section;
        a rectifying section;
        a switching section;
        a capacitance; and
        an anti-spike section;
    the circuit further comprising:
        a transformer section coupled to the rectifying section, the switching section, and the anti-spike section; and
        a power device coupled to a portion of the anti-spike section;
    the system being configured to regenerate substantially all energy utilized to power the power device via the coupling of the transformer section to the rectifying section, the capacitance, the switching section, and the anti-spike section.

2. The system according to claim 1 wherein the rectifying section is operatively configured as a full-wave rectifier.

3. The system according to claim 1 wherein the switching section comprises first and second switches.

4. The system according to claim 3 wherein the first and second switches are FETs.

5. The system according to claim 3 wherein:
the first switch is operatively configured to charge a capacitance in the power device; and
the second switch is operatively configured to discharge a capacitance in the power device.

6. The system according to claim 1 wherein the anti-spike section comprises first and second diodes.

7. The system according to claim 1 wherein the transformer is operatively configured as a regenerative transformer.

8. The system according to claim 1 wherein the transformer comprises first and second co-axial coils operatively configured to be part of the circuit board.

9. The system according to claim 1 wherein the power device is operatively configured as a MOSFET.

10. The system according to claim 1 wherein the power device is operatively configured as a IGBT.

11. The system according to claim 1 wherein the transformer is configured as a coreless transformer.

12. A method for driving a gate of a power device coupled within a circuit, the circuit operatively configured to substantially eliminate energy loss, the method comprising steps of:
(a) powering the circuit with a power source;
(b) simultaneously turning a first switch ON and a second switch OFF to allow energy from the power source to flow through the first switch to charge a power device capacitance via an inductance to turn ON the power device, to charge a source capacitance, and to return a portion of the energy to the power source;
(c) discharging energy from the inductance to further charge the power device capacitance with the discharged energy from the inductance;
(d) simultaneously turning the first switch OFF and the second switch ON to turn OFF the power device, to discharge the power device capacitance, and to allow energy flow from the power device capacitance to the source capacitance via the inductance to charge the source capacitance and return a portion of the energy to the power source; and
(e) discharging energy from the inductance to further charge the source capacitance and to return a portion of the energy to the power source.

13. The method according to claim 12 wherein steps (d) and (e) operatively perform a regeneration process of returning substantially all of the energy back to the power source.

14. The method according to claim 12 wherein steps (d) and (e) operatively perform a regeneration process, wherein the regenerated energy flows into and out of the power source via a rectifier.

15. The method according to claim 12 wherein the power device is operatively configured as an IGBT.

16. The method according to claim 12 wherein the power device is operatively configured as a FET.

* * * * *